US011247908B2

(12) United States Patent
Won et al.

(10) Patent No.: US 11,247,908 B2
(45) Date of Patent: Feb. 15, 2022

(54) NANOMATERIAL RIBBON PATTERNING METHOD AND NANOMATERIAL RIBBON PATTERN MANUFACTURED THEREBY (71) Applicant: CENTER FOR ADVANCED META-MATERIALS, Daejeon (KR)

(72) Inventors: Se Jeong Won, Daejeon (KR); Hyun June Jung, Daejeon (KR); Jae Hyun Kim, Daejeon (KR); Kwang Seop Kim, Daejeon (KR); Hak Joo Lee, Daejeon (KR); Bong Kyun Jang, Daejeon (KR)

(73) Assignee: CENTER FOR ADVANCED META-MATERIALS, Daejeon (KR)

( * ) Notice: Subject to any disclaimer, the term of this patent is extended or adjusted under 35 U.S.C. 154(b) by 45 days.

(21) Appl. No.: 16/954,535

(22) PCT Filed: Dec. 10, 2018

(86) PCT No.: PCT/KR2018/015584
§ 371 (c)(1),
(2) Date: Jun. 17, 2020

(87) PCT Pub. No.: WO2019/132312
PCT Pub. Date: Jul. 4, 2019

(65) Prior Publication Data
US 2020/0331760 A1 Oct. 22, 2020

(30) Foreign Application Priority Data
Dec. 29, 2017 (KR) .................. 10-2017-0183691

(51) Int. Cl.
*C01B 32/194* (2017.01)
*G03F 7/09* (2006.01)
(Continued)

(52) U.S. Cl.
CPC ............ *C01B 32/194* (2017.08); *G03F 7/094* (2013.01); *G03F 7/2059* (2013.01); *G03F 7/34* (2013.01);
(Continued)

(58) Field of Classification Search
CPC ... C01B 32/194; C01B 2204/06; G03F 7/094; G03F 7/2059; G03F 7/34; G03F 7/0002;
(Continued)

(56) References Cited

U.S. PATENT DOCUMENTS

| 2004/0043219 A1 | 3/2004 | Ito et al. |
| 2009/0214961 A1 | 8/2009 | Nozawa |

(Continued)

FOREIGN PATENT DOCUMENTS

| JP | 2002-234000 A | 8/2002 |
| KR | 10-2011-0026462 A | 3/2011 |

(Continued)

OTHER PUBLICATIONS

Liu, et al., Epitaxial Graphene Nanoribbon Array Fabrication Using BCP-Assisted Nanolithography, ACS Nano 2012; 6(8): 6786-6792 (Year: 2012).*

(Continued)

*Primary Examiner* — Daniel C. McCracken
(74) *Attorney, Agent, or Firm* — Revolution IP, PLLC (57) ABSTRACT

A nanomaterial ribbon patterning method includes: forming a first nanomaterial layer having a first threshold strain on an upper surface of a substrate; forming a second nanomaterial layer on an upper surface of the first nanomaterial layer; forming a thin layer having a second threshold strain smaller than the first threshold strain on an upper surface of the second nanomaterial layer; generating plural cracks on the thin layer and the second nanomaterial layer by applying tensile force to the substrate; placing a mask on an upper (Continued)

surface of the thin layer; removing the mask and peeling off the sacrificial layer on the upper surface of the thin layer; and removing the sacrificial layer to form a nanomaterial ribbon pattern.

8 Claims, 10 Drawing Sheets

(51) Int. Cl.
  *G03F 7/20* (2006.01)
  *G03F 7/34* (2006.01)
  *B82Y 15/00* (2011.01)
  *B82Y 30/00* (2011.01)
  *B82Y 40/00* (2011.01)

(52) U.S. Cl.
  CPC .............. *B82Y 15/00* (2013.01); *B82Y 30/00* (2013.01); *B82Y 40/00* (2013.01); *C01B 2204/06* (2013.01); *C01P 2004/17* (2013.01)

(58) Field of Classification Search
  CPC ......... B82Y 15/00; B82Y 30/00; B82Y 40/00; B82Y 10/00; C01P 2004/17; H01L 29/66015; H01L 29/0673; H01L 29/1606; B82B 1/00; B82B 3/00; B82B 3/0014; B82B 1/005
  See application file for complete search history.

(56) References Cited

U.S. PATENT DOCUMENTS

| | | | |
|---|---|---|---|
| 2011/0300338 | A1 | 12/2011 | Shin et al. |
| 2015/0362470 | A1* | 12/2015 | Jung ...................... C01B 32/05 73/31.05 |

FOREIGN PATENT DOCUMENTS

| | | | | |
|---|---|---|---|---|
| KR | 10-2011-0133452 | A | 12/2011 | |
| KR | 10-2015-0142269 | A | 12/2015 | |
| KR | 20150142269 | * | 12/2015 | ............. C01B 32/05 |
| KR | 10-1789921 | B1 | 10/2017 | |

OTHER PUBLICATIONS

Sakorikar, et al., Thickness-dependent Crack Propogation in Uniaxially Strained Conducting Graphene Oxide Films on Flexible Subsrates, Scientific Reports 2017; 7: 2598, pp. 1-10 (Year: 2017).*

International Search Report for PCT/KR2018/015584 dated May 30, 2019 from Korean Intellectual Property Office.

Sakorikar, T et al., "Thickness-dependent Crack Propagation in Uniaxially Strained Conducting Graphene Oxide Films on Flexible Substrates", Scientific Reports, Jun. 1, 2017, vol. 7, document No. 2598, inner pp. 1-10.

* cited by examiner

NANOMATERIAL RIBBON PATTERNING METHOD AND NANOMATERIAL RIBBON PATTERN MANUFACTURED THEREBY

TECHNICAL FIELD

The present invention relates to a nanomaterial ribbon patterning method and a nanomaterial ribbon pattern formed thereby, and, more particularly, to a nanomaterial ribbon patterning method, which allows control of the width, length and spacing of a nanomaterial ribbon pattern, and a nanomaterial ribbon pattern formed thereby.

BACKGROUND ART

Among nanomaterials, graphene refers to a two-dimensional thin film constituted by a monolayer of carbon atoms and having a honeycomb structure. The carbon atoms form a hexagonal carbon network having a two-dimensional structure upon chemical bonding by sp2 hybrid orbitals. An aggregate of carbon atoms having such a planar structure is graphene and has a thickness of about 0.34 nm, which corresponds to only one carbon atom.

Graphene has very good structural and chemical stability, and acts as an excellent conductor providing a charge mobility about 100 times faster than silicon and allowing flow of about 100 times more electric current than copper. In addition, graphene has better transparency than indium tin oxide (ITO), which is used as a transparent electrode in the art. Various studies have been conducted to apply graphene to electronic devices using such characteristics of graphene.

Pure graphene not subjected to doping or patterning has a conduction band and a valence band meeting together and thus does not have an energy band gap. For various applications of graphene to electronic devices, various studies have been conducted to form an energy band gap in graphene by doping or patterning the graphene in a particular shape. For example, nanoscale patterning of the graphene in a nanoribbon shape is one method for forming the energy band gap in the graphene. Graphene nanoribbons may have an energy band gap like a semiconductor through suitable selection of a width and an edge shape of the graphene nanoribbons.

Application of the graphene nanoribbons has been expanded to various fields including bio-sensing. Since a terahertz wave is an electromagnetic wave having permeability and a longer wavelength than visible light or infrared light, the terahertz wave has high permeability like X rays and lower energy than X rays to provide no damage to the human body and to be used in diagnosis of tissue pathology. Such a terahertz wave can be applied to bio-sensing and, since the graphene nanoribbons can improve detection sensitivity of the terahertz wave, the graphene nanoribbons have been actively studied in the art.

In order to apply the terahertz wave to a certain biomaterial while improving detection sensitivity of the terahertz wave, it is necessary to control the width, spacing, length and the like of the graphene nanoribbons. As a result, the shape of the graphene nanoribbons can be controlled. For example, the graphene nanoribbons can be formed in a large-area arrangement or in a slit shape.

Conventionally, a graphene nanoribbon pattern is formed by E-beam lithography, dip-pen nanolithography, scanning tunneling microscopy lithography, and the like. However, such a typical method of forming a graphene nanoribbon pattern has difficulty in formation of the nanomaterial ribbon pattern in a large area and a problem of low productivity.

To overcome such problems, crack-lithography using cracks is used. However, typical crack-lithography has a limit in control of the width, spacing, and length of the pattern in the case where notches are not previously formed in order to guide generation of cracks in a nanomaterial layer. Therefore, the typical crack-lithography requires a process of forming notches, thereby providing a problem of increase in the number of processes. Moreover, it is difficult for the typical crack-lithography to achieve patterning of a two-dimensional nanomaterial.

DISCLOSURE

Technical Problem

Embodiments of the present invention have been conceived to solve the problem of the background art and it is an aspect of the present invention to provide a nanomaterial ribbon patterning method, which allows control of the width, length and spacing of a nanomaterial ribbon pattern, and a nanomaterial ribbon pattern formed thereby.

It should be understood that the present invention is not limited thereto and the above and other aspects of the present invention will become apparent to those skilled in the art from the detailed description of the following embodiments.

Technical Solution

In accordance with one aspect of the present invention, a nanomaterial ribbon patterning method includes: forming a first nanomaterial layer having a first threshold strain on an upper surface of a substrate; forming a second nanomaterial layer on an upper surface of the first nanomaterial layer; forming a thin layer having a second threshold strain smaller than the first threshold strain on an upper surface of the second nanomaterial layer; generating plural cracks on the thin layer and the second nanomaterial layer by applying tensile force to the substrate; placing a mask on an upper surface of the thin layer, followed by forming a sacrificial layer on a portion of the thin layer and portions of the cracks not masked by the mask; removing the mask and peeling off the sacrificial layer on the upper surface of the thin layer, the thin layer and the second nanomaterial layer from the first nanomaterial layer using an adhesive film; performing etching to allow only the sacrificial layer on the cracks and the first nanomaterial layer under the sacrificial layer to remain; and removing the sacrificial layer to form a nanomaterial ribbon pattern constituted by a portion of the first nanomaterial layer remaining on the upper surface of the substrate.

In one embodiment, the nanomaterial ribbon pattern may have a length corresponding to a length of the portions of the cracks not masked by the mask in formation of the sacrificial layer.

In one embodiment, the nanomaterial ribbon pattern may have a spacing regulated by regulating a thickness of the thin layer in formation of the thin layer.

In one embodiment, the nanomaterial ribbon pattern may have a width regulated by regulating strain of the substrate in generation of the cracks.

In accordance with another aspect of the present invention, a nanomaterial ribbon pattern formed by the nanomaterial ribbon patterning method is provided.

In accordance with a further aspect of the present invention, a nanomaterial ribbon patterning method includes: forming a first nanomaterial layer having a first threshold strain on an upper surface of a substrate; forming a second nanomaterial layer on an upper surface of the first nanomaterial layer; forming a thin layer having a second threshold strain smaller than the first threshold strain on an upper surface of the second nanomaterial layer; generating plural cracks on the thin layer and the second nanomaterial layer by applying tensile force to the substrate; placing a mask on an upper surface of the thin layer, followed by forming a sacrificial layer on a portion of the thin layer and portions of the cracks not masked by the mask; removing the mask and performing etching to remove portions of the first nanomaterial layer not covered by the sacrificial layer and the thin layer; peeling off the sacrificial layer on the upper surface of the thin layer, the thin layer and the second nanomaterial layer from the first nanomaterial layer using an adhesive film; and removing the sacrificial layer from the upper surface of the first nanomaterial layer to form a nanomaterial ribbon pattern constituted by a portion of the first nanomaterial layer remaining on the upper surface of the substrate.

In one embodiment, a portion of the first nanomaterial layer not remaining on the upper surface of the substrate in formation of the nanomaterial ribbon pattern may have a length corresponding to a length of portions of the cracks masked by the mask in formation of the sacrificial layer.

In one embodiment, a distance between portions of the first nanomaterial layer not remaining on the upper surface of the substrate in formation of the nanomaterial ribbon pattern may be regulated by regulating a thickness of the thin layer in formation of the thin layer.

In one embodiment, the portion of the first nanomaterial layer not remaining on the upper surface of the substrate in formation of the nanomaterial ribbon pattern may have a width regulated by regulating strain of the substrate in generation of the cracks.

In accordance with yet another aspect of the present invention, a nanomaterial ribbon pattern formed by the nanomaterial ribbon patterning method is provided.

Advantageous Effects

According to embodiments of the present invention, a more accurate line type nanomaterial ribbon pattern can be formed using cracks by allowing control of the width, spacing and length of the cracks corresponding to portions of a first nanomaterial layer, which will form the nanomaterial ribbon pattern.

In addition, according to the embodiments of the present invention, a more accurate sheet type nanomaterial ribbon pattern can be formed using cracks by allowing control of the width, spacing and length of the cracks corresponding to portions of the first nanomaterial layer to be removed in order to form the nanomaterial ribbon pattern.

Further, according to the embodiments of the present invention, a more accurate nanomaterial ribbon pattern can be formed by regulating the thickness or strain of a thin layer or by regulating a shape and size of a mask.

It should be understood that the present invention is not limited to the above effects and other advantageous effects of the present invention can become apparent from the detailed description and the claims of the invention.

BEST MODE

Hereinafter, embodiments of the present invention will be described in detail with reference to the accompanying drawings. It should be understood that the present invention may be embodied in different ways and is not limited to the following embodiments. In the drawings, portions irrelevant to the description will be omitted for clarity. Like components will be denoted by like reference numerals throughout the specification.

When an element is referred to as being "connected to", "contacting" or "coupled to" another element, it may be directly connected to, contact, or coupled to the other element or intervening elements may be present. In addition, the terms "comprises," "comprising," "includes," and/or "including," when used in this specification, specify the presence of stated features, but do not preclude the presence or addition of one or more other features.

The terminology used herein is for the purpose of describing particular embodiments and is not intended to be limiting. As used herein, the singular forms, "a," and "an" are intended to include the plural forms as well, unless the context clearly indicates otherwise. Moreover, as used herein, the terms "comprises," "comprising," "includes," and/or "including," specify the presence of stated features, integers, steps, operations, elements, components, and/or groups thereof, but do not preclude the presence or addition of one or more other features, integers, steps, operations, elements, components, and/or groups thereof.

Hereinafter, embodiments of the present invention will be described in detail with reference to the accompanying drawings.

Figure 1:
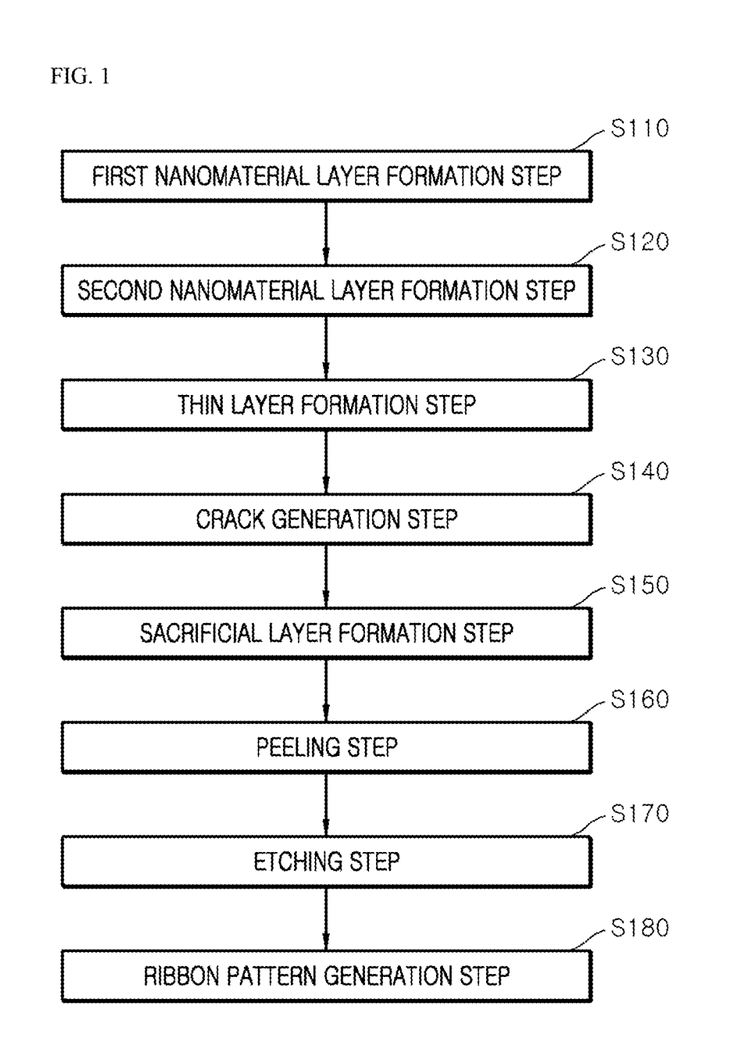
FIG. 1 is a flowchart illustrating a nanomaterial ribbon patterning method according to a first embodiment of the present invention.
Figure 2:
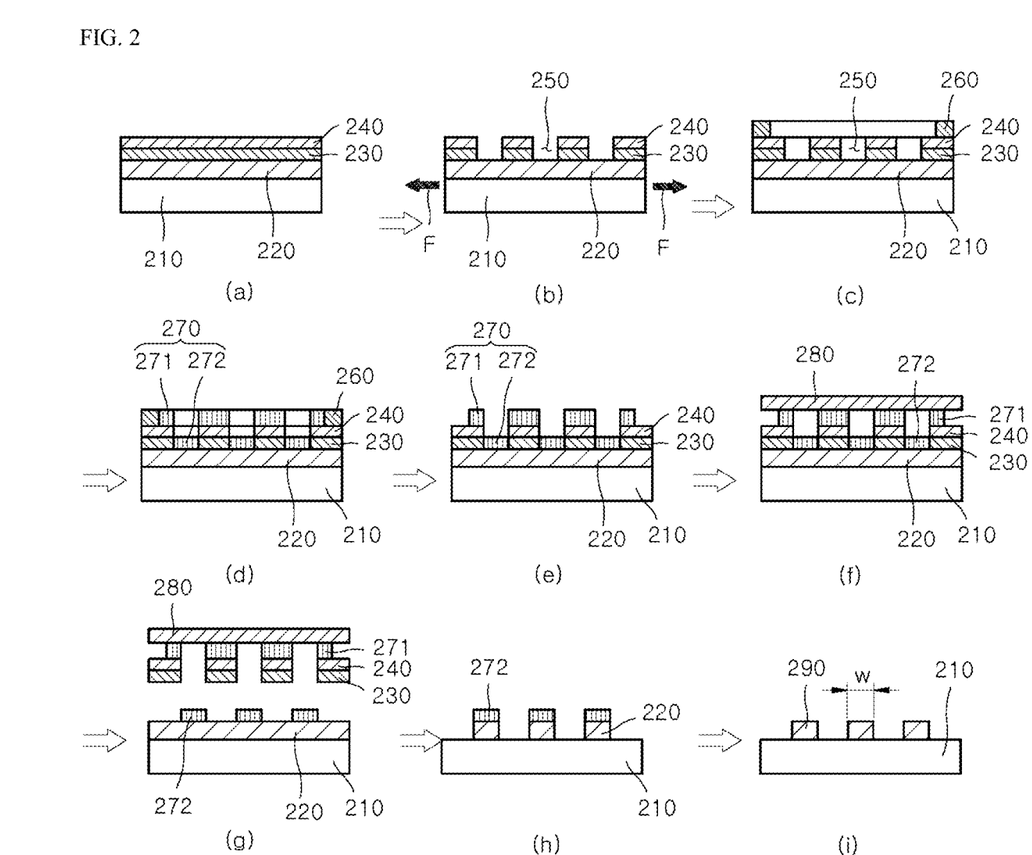
FIG. 2 is sectional views illustrating the nanomaterial ribbon patterning method according to the first embodiment of the present invention.
Figure 3:
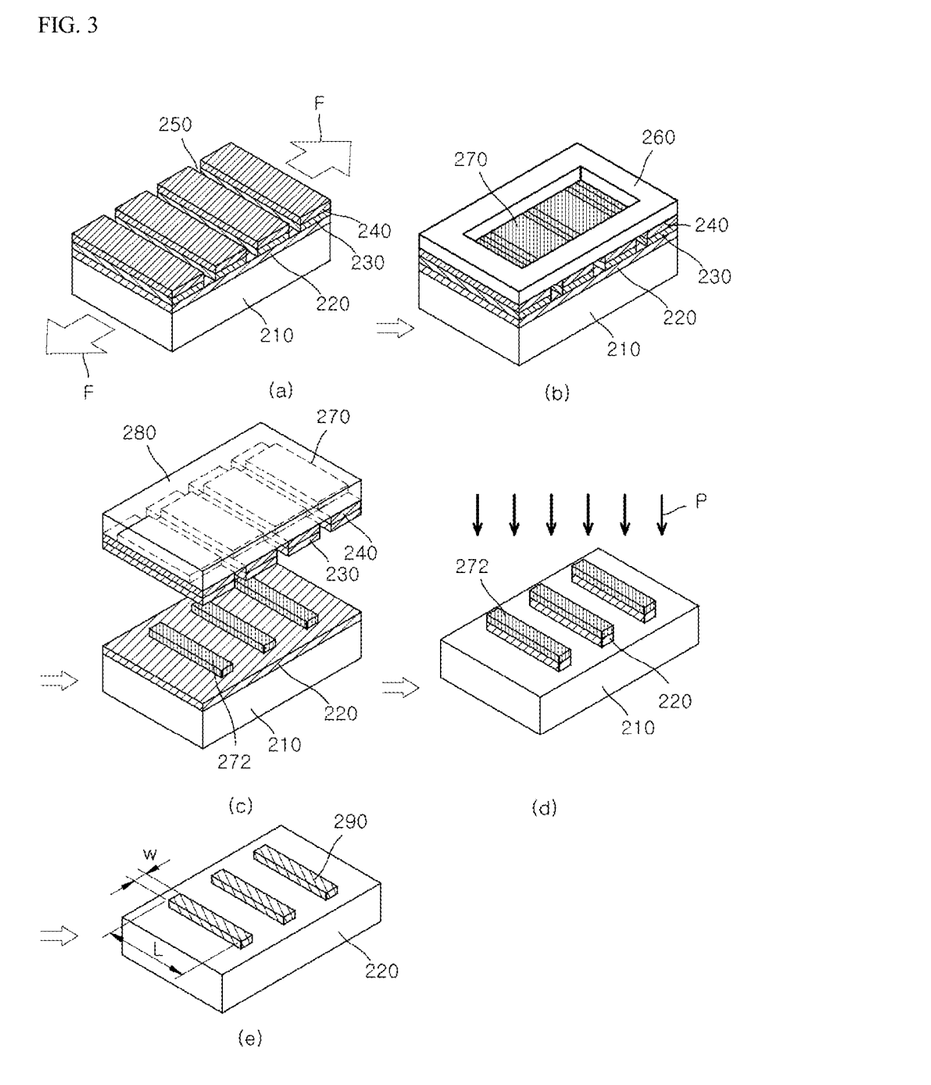
FIG. 3 is views illustrating the nanomaterial ribbon patterning method according to the first embodiment of the present invention.

FIG. 1 is a flowchart illustrating a nanomaterial ribbon patterning method according to a first embodiment of the present invention, FIG. 2 is sectional views illustrating the nanomaterial ribbon patterning method according to the first embodiment of the present invention, and FIG. 3 is views illustrating the nanomaterial ribbon patterning method according to the first embodiment of the present invention. The nanomaterial ribbon patterning method according to the first embodiment relates to positive type patterning.

Referring to FIG. 1 to FIG. 3, the nanomaterial ribbon patterning method may include a first nanomaterial layer formation step S110, a second nanomaterial layer formation step S120, a thin layer formation step S130, a crack generation step S140, a sacrificial layer formation step S150, a peeling step S160, an etching step S170, and a ribbon pattern generation step S180.

The first nanomaterial layer formation step S110 may be a step wherein a first nanomaterial layer 220 is formed on an upper surface of the substrate 210.

Here, the substrate 210 may be formed of a polymer material and may have a film shape. The first nanomaterial layer 220 may be formed over the entirety of the upper surface of the substrate 210.

The first nanomaterial may include one of molybdenum disulfide ($MoS_2$), molybdenum diselenide ($MoSe_2$), tungsten disulfide ($WS_2$), tungsten diselenide ($WSe_2$), and graphene. The first nanomaterial may be a two-dimensional nanomaterial.

The first nanomaterial layer 220 may have a first threshold strain.

The second nanomaterial layer formation step S120 may be a step wherein a second nanomaterial layer 230 is formed on an upper surface of the first nanomaterial layer 220.

The second nanomaterial may be the same as the first nanomaterial. Thus, the first nanomaterial may be a two-dimensional nanomaterial. Further, the second nanomaterial layer 230 may have a first threshold strain like the first nanomaterial layer 220, but is not limited thereto.

When the first nanomaterial and the second nanomaterial are graphene, the first nanomaterial layer 220 may be a first graphene layer and the second nanomaterial layer 230 may be a second graphene layer.

The thin layer formation step S130 may be a step wherein a thin layer 240 is formed on an upper surface of the second nanomaterial layer 230.

The thin layer 240 may have a second threshold strain smaller than the first threshold strain. Thus, the thin layer 240 may have higher brittleness than the first nanomaterial layer 220 and the second nanomaterial layer 230. Furthermore, the thin layer 240 may have higher brittleness than the substrate 210.

The thin layer 240 may be formed of aluminum oxide ($Al_2O_3$) (see FIG. 2(a)).

The crack generation step S140 may be a step wherein plural cracks 250 are generated on the thin layer 240 and the second nanomaterial layer 230 by applying tensile force F to the substrate 210.

In the crack generation step S140, tensile force F is applied to both sides of the substrate 210 in order to stretch the substrate 210 by pulling the substrate 210 in opposite directions. In addition, as the substrate 210 is stretched, the first nanomaterial layer 220, the second nanomaterial layer 230 and the thin layer 240 formed on the substrate 210 may also be stretched.

Upon stretching the substrate 210, the cracks 250 can be generated on the thin layer 240 having relatively high brittleness. Further, elongation of the second nanomaterial layer 230 can be restricted by bonding force to the thin layer 240, whereby the cracks 250 can be generated on the second nanomaterial layer 230.

The locations of the cracks generated on the second nanomaterial layer 230 may be the same as the cracks generated on the thin layer 240 and the size of the cracks generated on the second nanomaterial layer 230 may be the same as the size of the cracks generated on the thin layer 240. Accordingly, the cracks generated on the second nanomaterial layer 230 may be continuous to the cracks generated on the thin layer 240.

When the cracks are generated on the second nanomaterial layer 230, sliding occurs at an interface between the second nanomaterial layer 230 and the first nanomaterial layer 220. As a result, even when the cracks are generated in the second nanomaterial layer 230, the first nanomaterial layer 220 does not suffer from cracking (see FIG. 2(b) and FIG. 3(a)).

Figure 4:
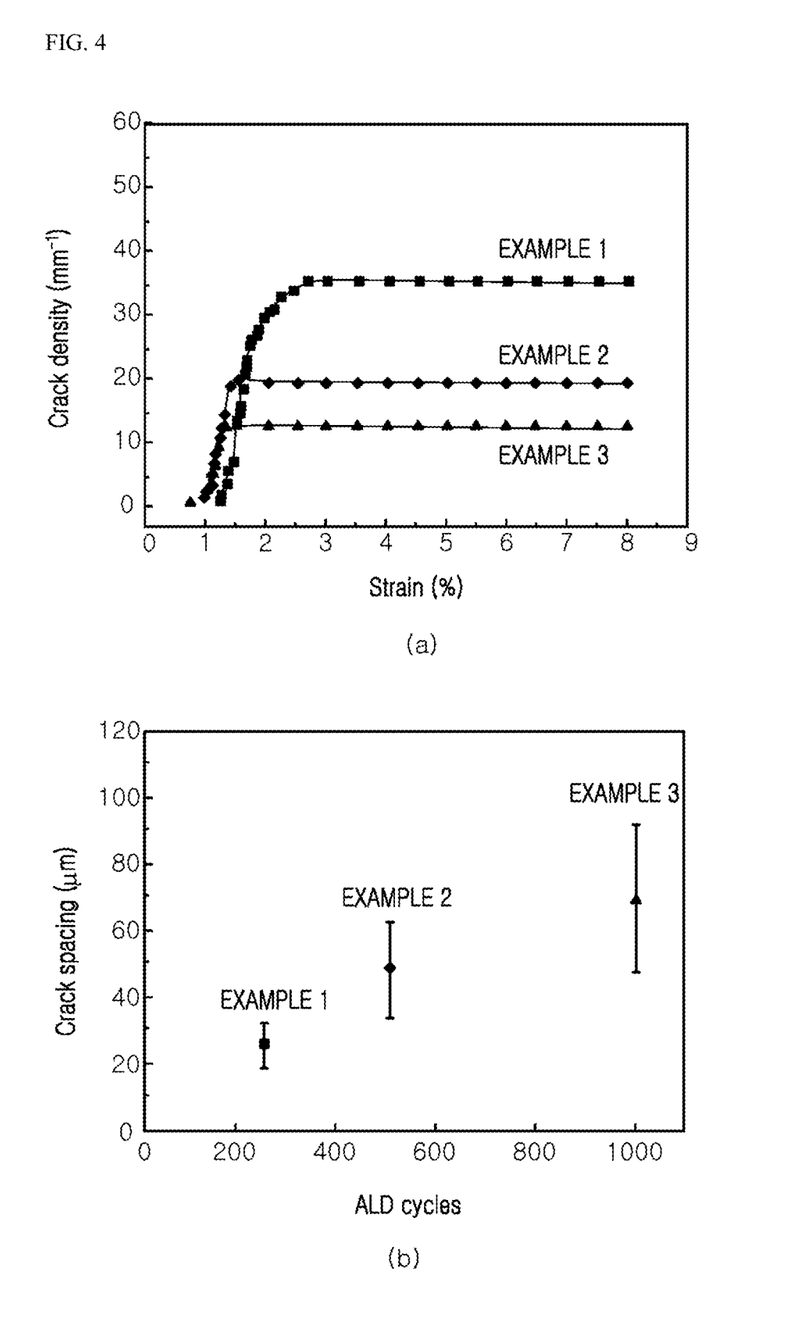
FIG. 4 is graphs depicting relationships between crack density and strain and between crack spacing and thickness of a thin layer in the nanomaterial ribbon patterning method according to the first embodiment of the present invention.

FIG. 4 is graphs depicting relationships between crack density and strain and between crack spacing and thickness of a thin layer in the nanomaterial ribbon patterning method according to the first embodiment of the present invention. In FIG. 4, (a) is a graph depicting a relationship between strain and crack density and (b) is a graph depicting a relationship between crack spacing and the thickness of the thin layer 240. The thickness of the thin layer 240 is indicated by the number of cycles of ALD (atomic layer deposition), in which a greater number of cycles means a greater thickness. Here, a greater thickness of the thin layer can provide higher stiffness thereof and the stiffness can be regulated by regulating not only the thickness of the thin layer 240 but also the material or manufacturing process of the thin layer 240.

Example 1 is a case where the thin layer 240 has a thickness of 250 cycles, Example 2 is a case where the thin layer 240 has a thickness of 500 cycles, and Example 3 is a case where the thin layer 240 has a thickness of 1,000 cycles. In each of these examples, the substrate 210, the first nanomaterial layer 220 and the second nanomaterial layer 230 are formed under the same conditions.

Referring to FIG. 4(a), it can be seen that, in each of Examples 1 to 3, the crack density rapidly increases with increasing strain and become constant after the strain reaches a certain strain value. Here, the crack density can be defined as the number of cracks per unit length or the total length of cracks per unit area.

Referring to FIG. 4(b), it can be seen that the crack spacing increases with increasing thickness of the thin layer 240. In other words, it can be seen that the crack spacing increases with increasing thickness of the thin layer 240.

At an initial strain, the crack spacing decreases without increase in width of the cracks, that is, the crack density increases as the number of cracks increases, and when the crack density becomes constant, the crack spacing does not increase whereas the crack width increases.

Referring to FIG. 4(a), it can be seen that, when the substrate 210 is stretched under the same strain condition, the crack density varies depending upon the thickness of the thin layer 240. That is, it can be seen that, since tensile load for generation of cracks increases with increasing thickness of the thin layer 240, the crack density decreases with increasing thickness of the thin layer 240 under the same strain condition.

In other words, cracks are generated when tensile strength applied to the thin layer 240 is greater than tensile strength applied to the thin layer 240. Since increase in thickness of the thin layer 240 can cause decrease in tensile stress under the same strain conditions, crack generation is suppressed, thereby providing a low crack density.

Further, referring to FIG. 4(b), it can be seen that the crack spacing increases with increasing thickness of the thin layer 240. That is, as the thickness of the thin layer 240 increases, it is necessary to increase tensile load in order to allow crack generation. Under the same strain conditions, the thin layer 240 undergoes less generation of cracks with increasing thickness of the thin layer 240, thereby increasing the crack spacing.

In other words, since the crack density means the number of cracks per unit length as described above, an inverse value of the crack density may mean the crack spacing. Thus, since the crack density decreases with increasing thickness of the thin layer 240, the crack spacing increases.

As such, the spacing between the cracks 250 can be regulated by regulating the thickness of the thin layer 240. By way of example, the spacing between the cracks 250 can be regulated by regulating the thickness of the thin layer 240. In addition, the distance between the nanomaterial ribbon patterns 290 can be regulated by regulating the spacing between the cracks 250.

The sacrificial layer formation step S150 may be a step in which a mask 260 is disposed on an upper surface of the thin layer 240 and a sacrificial layer 270 is formed on a portion of the thin layer 240 and portions of the cracks 250 not masked by the mask 260.

In the sacrificial layer formation step S150, the sacrificial layer 270 may be formed on an upper surface of the thin layer 240 and an upper surface of the first nanomaterial layer 220 exposed by the cracks 250.

The sacrificial layer 270 may be formed by various deposition methods, such as e-beam evaporation, thermal evaporation, sputtering, and the like. The sacrificial layer 270 may be formed of a material, for example, copper, which allows easy deposition and easy removal by etching.

The sacrificial layer 270 may have a first sacrificial pattern 271 and a second sacrificial pattern 272. Here, the first sacrificial pattern 271 may refer to a portion of the sacrificial layer 270 formed on the upper surface of the thin layer 240. In addition, the second sacrificial pattern 272 may refer to a portion of the sacrificial layer 270 formed on the cracks 250 and on the upper surface of the first nanomaterial layer 220. Accordingly, the first sacrificial pattern 271 may have the same width as the spacing between the cracks 250 and the second sacrificial pattern 272 may have the same width as the width of the cracks 250 (see FIGS. 2 (d) and (e) and FIG. 3(b)).

Figure 5:
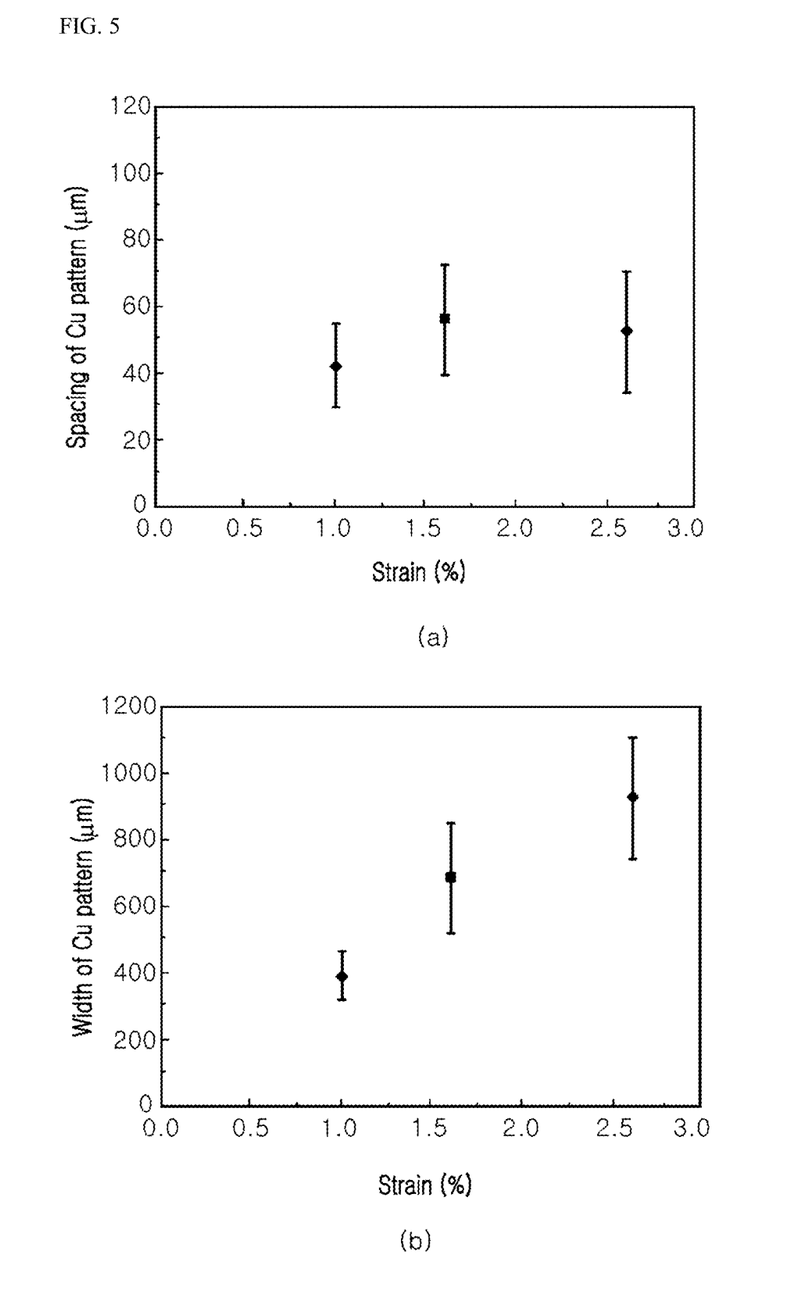
FIG. 5 is graphs depicting relationships between spacing of the nanomaterial ribbon pattern and strain and between width of a nanomaterial ribbon pattern and strain in the nanomaterial ribbon patterning method according to the first embodiment of the present invention.

FIG. 5 is graphs depicting relationships between spacing of the nanomaterial ribbon pattern and strain and between width of a nanomaterial ribbon pattern and strain in the nanomaterial ribbon patterning method according to the first embodiment of the present invention. FIG. 5 shows results of an experiment performed under conditions that the thin layer 240 is formed through 500 cycles of ALD, and the substrate 210, the first nanomaterial layer 220, the second nanomaterial layer 230 and tensile strain are the same as those of Example 2 of FIG. 4. The sacrificial layer is formed of copper.

FIG. 5(a) shows the spacing between the second sacrificial patterns 272 according to strain.

Referring to FIG. 5(a), it can be seen that the spacing between the second sacrificial patterns 272 according to strain is similar to the spacing between the cracks 250 under the condition that the thin layer 240 is formed through 500 cycles of ALD in FIG. 4(b).

Further, it can be seen that the spacing between the second sacrificial patterns 272 does not significantly increase even with increase in strain and is substantially constant in a certain range of strain, particularly, in the range of 1.5 to 2.75.

On the other hand, as shown in FIG. 5(b), it can be seen that the width of the second sacrificial pattern 272 substantially linearly increased as strain increased. That is, when strain increases, the width of the second sacrificial pattern 272 can increase, thereby enabling regulation of width W of a nanomaterial ribbon pattern 290 described below.

Further, since the length of the second sacrificial pattern 272 can also be regulated by regulating the pattern shape and size of the mask 260, a length L of the nanomaterial ribbon pattern 290 can be regulated therethrough. That is, as the length of the portions of the cracks 250 not masked by the mask 260 increases, the length L of the nanomaterial ribbon pattern 290 can increase.

The peeling step S160 may be a step wherein the mask 260 is removed and the sacrificial layer on the upper surface of the thin layer 240, that is, the first sacrificial pattern 271, the thin layer 240 and the second nanomaterial layer 230 are peeled off of the first nanomaterial layer 220 using an adhesive film 280.

In the peeling step S160, when the adhesive film 280 is moved away from the substrate 210, the first sacrificial pattern 271 adhesively attached to the adhesive film 280, the thin layer 240 formed on a lower surface of the first sacrificial pattern 271, and the second nanomaterial layer 230 formed on a lower surface of the thin layer 240 may be peeled off of the first nanomaterial layer 220 together with the adhesive film 280. In addition, the second sacrificial pattern 272 formed on the cracks 250 may remain on the upper surface of the first nanomaterial layer 220.

Although the adhesive film 280 is illustrated as being adhesively attached only to the first sacrificial pattern 271 in FIG. 2, it should be understood that the present invention is not limited thereto. That is, the adhesive film 280 may be provided to a portion of the thin layer 240 on which the first sacrificial pattern 271 is not formed, and the first sacrificial pattern 271 may be inserted into the adhesive film 280 such that even a side surface of the first sacrificial pattern 271 can be adhesively attached to the adhesive film 280 (see FIGS. 2(f) and (g) and FIG. 3(c)).

The etching step S170 may be a step in which etching P is performed to allow the sacrificial layer formed on the cracks 250, that is, only the second sacrificial pattern 272 and the first nanomaterial layer 220 formed on the lower surface of the second sacrificial pattern 272, to remain.

In the etching step (S170), etching may be performed by oxygen plasma etching, which can effectively remove graphene. Thus, by oxygen plasma etching (P), exposed portions of the first nanomaterial layer 220 can be completely removed excluding portions of the first nanomaterial layer 220 covered by the second sacrificial pattern 272 (see FIG. 2(h) and FIG. 3(d)).

The nanomaterial ribbon pattern generation step S180 may be a step in which a nanomaterial ribbon pattern 290 constituted by a portion of the first nanomaterial layer remaining on the upper surface of the substrate 210 is formed by removing the sacrificial layer, specifically the second sacrificial pattern 272.

The nanomaterial ribbon pattern 290 generated in the nanomaterial ribbon pattern generation step S180 may be formed to a width corresponding to the width of the cracks 250 formed on the thin layer 240 and the second nanomaterial layer 230 and to a spacing corresponding to the spacing between the cracks 250.

Accordingly, the distance between the nanomaterial ribbon patterns 290 may be regulated by regulating the thickness of the thin layer 240 in the thin layer formation step S130.

Further, the width W of the nanomaterial ribbon pattern 290 may be regulated by regulating the strain of the substrate 210 in the crack generation step S140.

Further, the length L of the nanomaterial ribbon pattern 290 may correspond to the length of the portions of the cracks 250 not masked by the mask 260. Thus, the length L of the nanomaterial ribbon pattern 290 may be regulated by regulating the length of the portions of the cracks 250 not masked by the mask 260 in the sacrificial layer formation step (S150).

Figure 6:
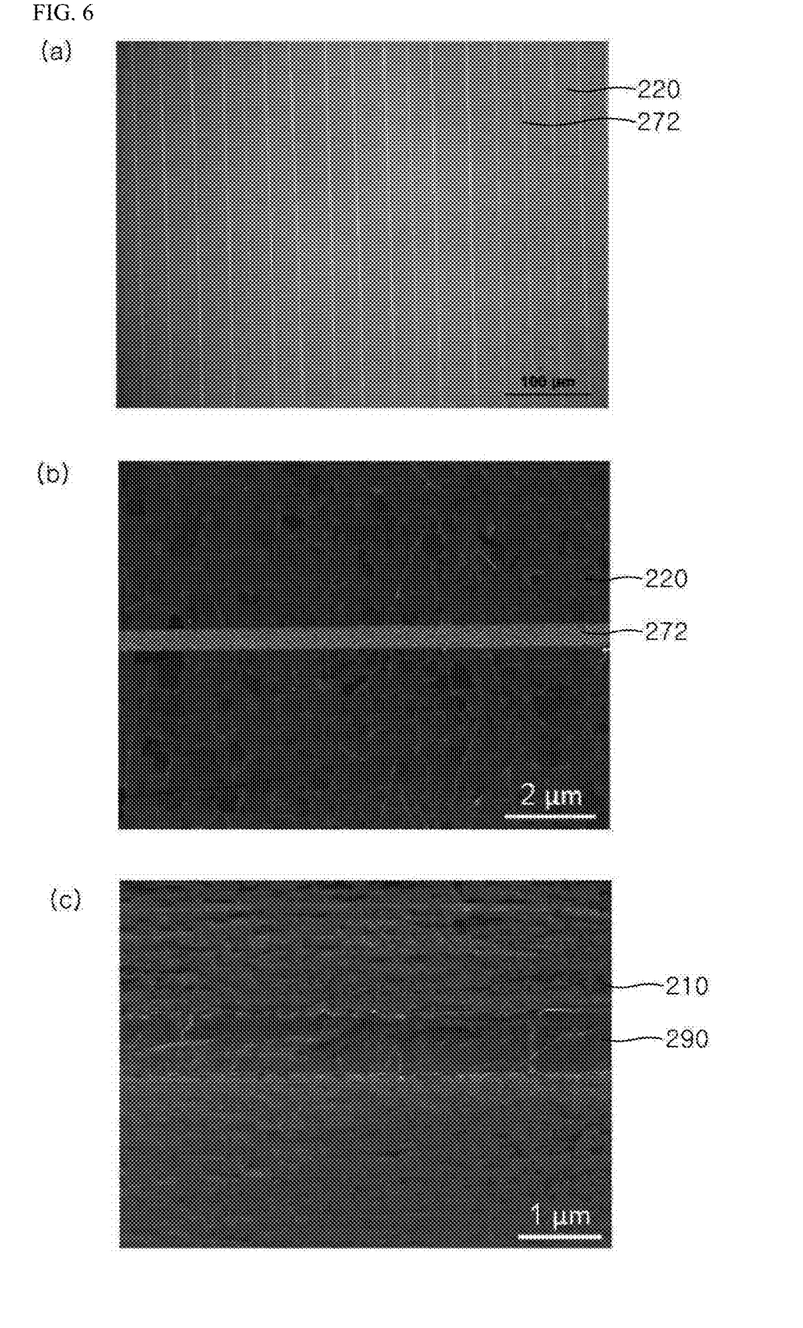
FIG. 6 is pictures showing a first nanomaterial layer, a second sacrificial pattern and a nanomaterial ribbon pattern formed by the nanomaterial ribbon patterning method according to the first embodiment of the present invention.

FIG. 6 is pictures showing the first nanomaterial layer, the second sacrificial pattern and the nanomaterial ribbon pattern formed by the nanomaterial ribbon patterning method according to the first embodiment of the present invention. Here, graphene was used as the nanomaterial.

Referring to FIG. 6(a), the second sacrificial pattern 272 formed on the upper surface of the first nanomaterial layer 220 may be arranged at relatively constant intervals and may have high linearity. In addition, referring to FIG. 6(b), the second sacrificial pattern 272 may have a substantially constant width. Further, referring to FIG. 6(c), the nanomaterial ribbon pattern 290 remaining on the upper surface of the substrate 210 after removal of the second sacrificial pattern 272 may have a substantially constant width and high linearity.

As such, according to the present invention, the nanomaterial ribbon pattern 90 may be formed in a line shape, and the width, length and spacing of the nanomaterial ribbon pattern 290 may be accurately controlled in formation of the nanomaterial ribbon pattern.

Figure 7:
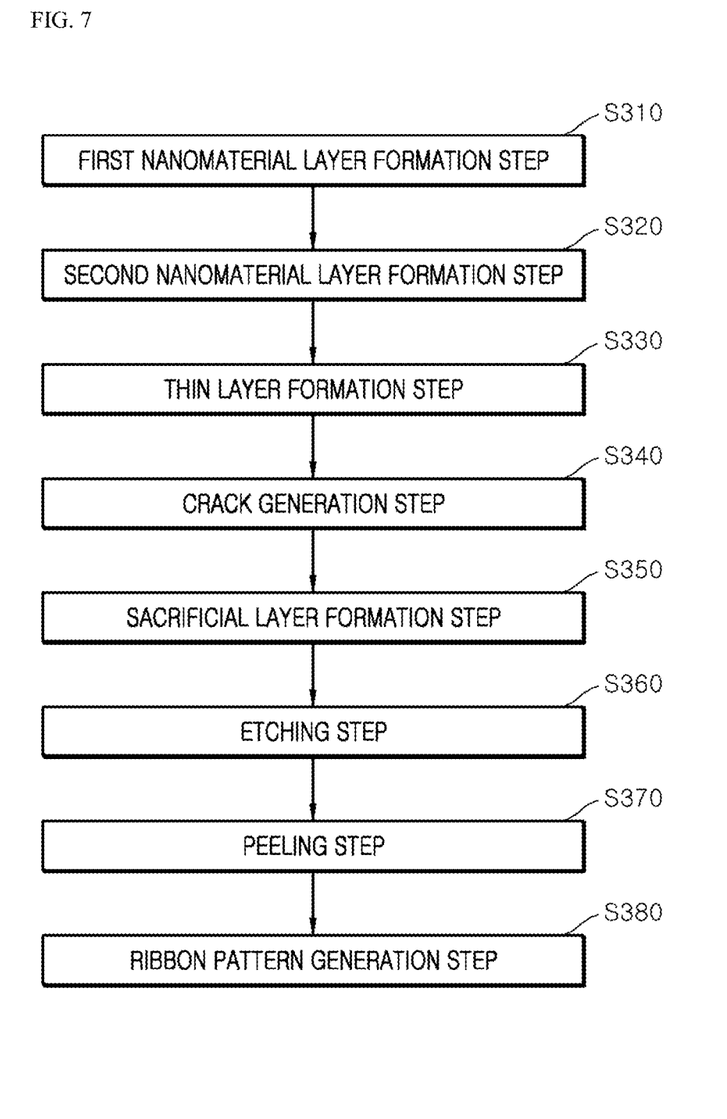
FIG. 7 is a flowchart illustrating a nanomaterial ribbon patterning method according to a second embodiment of the present invention.
Figure 8:
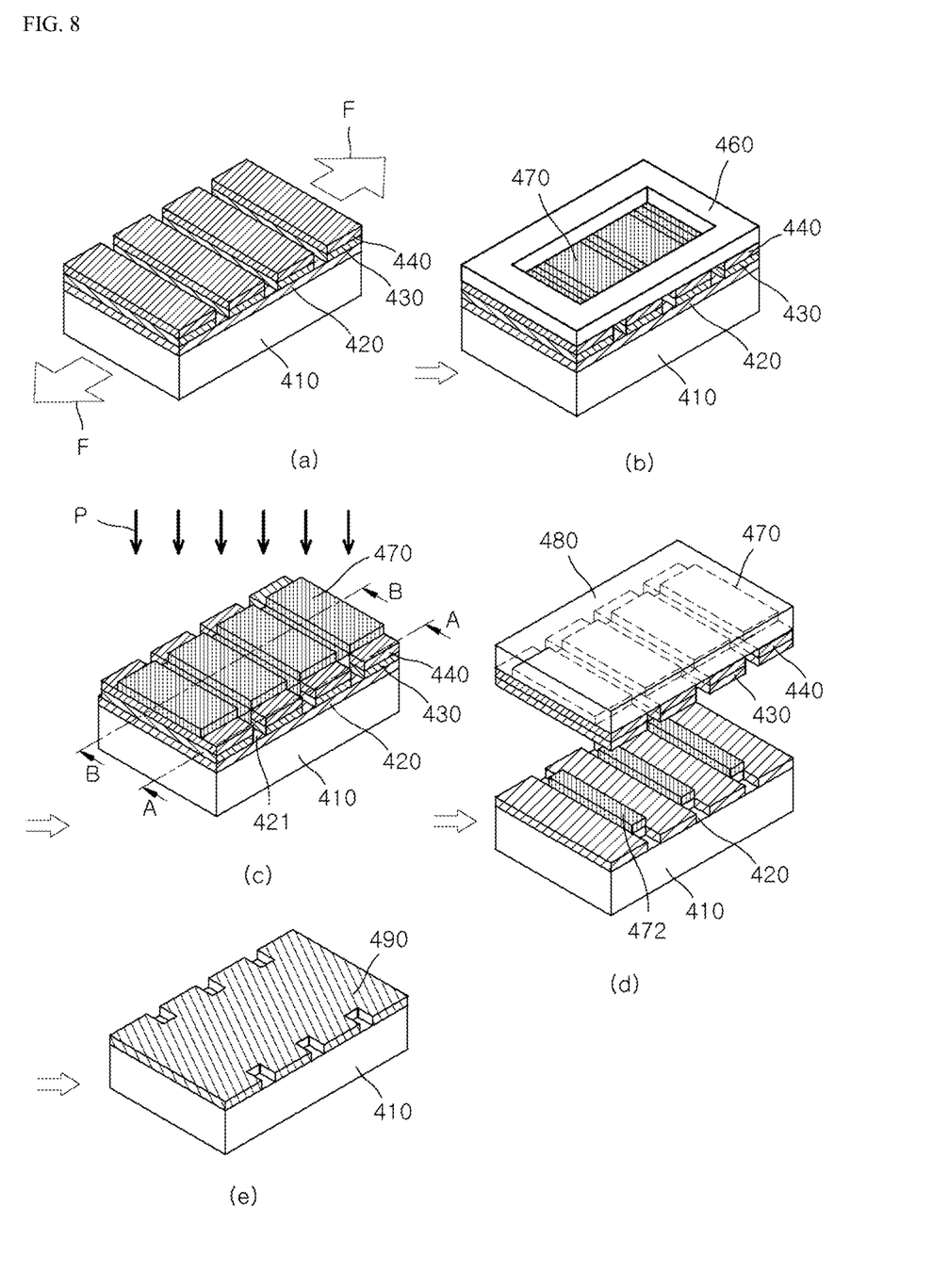
FIG. 8 is views illustrating the nanomaterial ribbon patterning method according to the second embodiment of the present invention.
Figure 9:
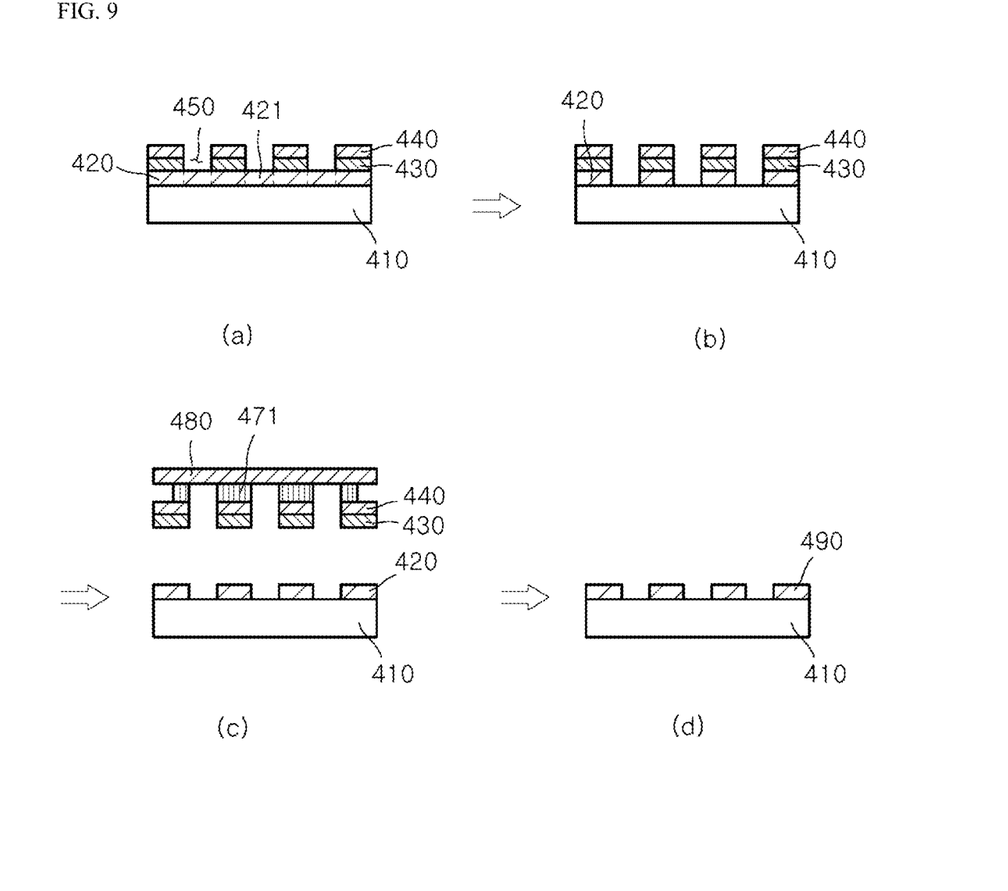
FIG. 9 is sectional views taken line A-A of FIG. 8 and illustrating the nanomaterial ribbon patterning method according to the second embodiment of the present invention.
Figure 10:
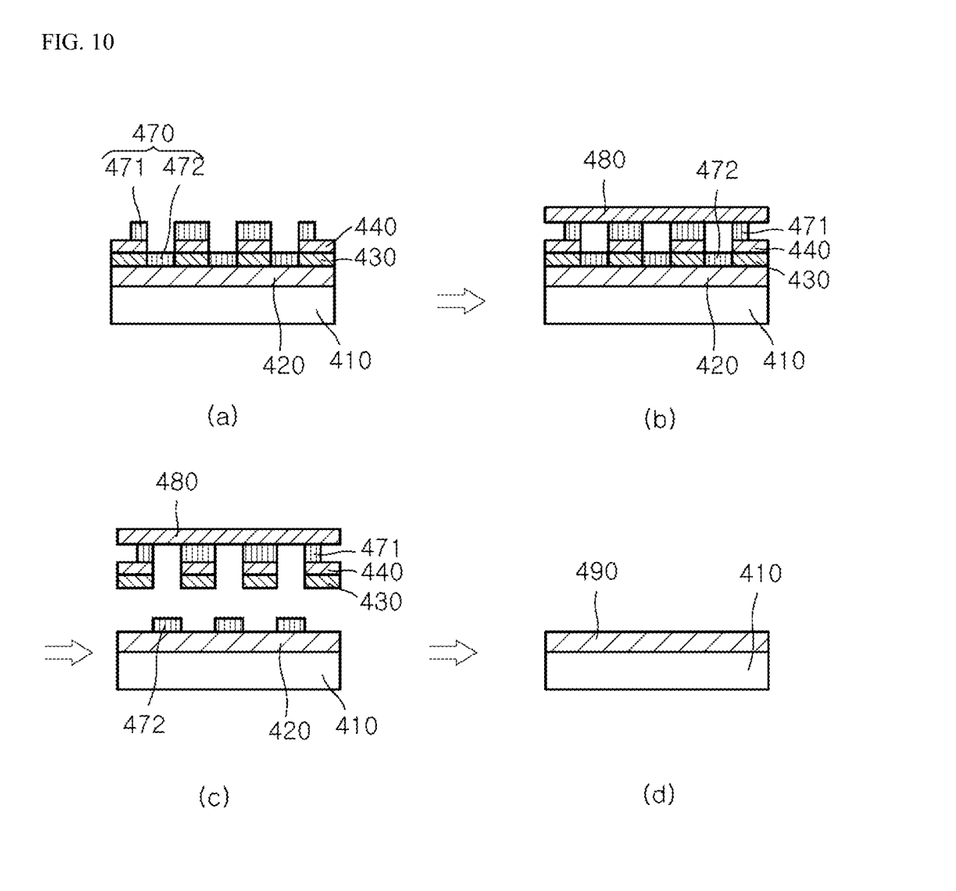
FIG. 10 is sectional views taken line B-B of FIG. 8 and illustrating the nanomaterial ribbon patterning method according to the second embodiment of the present invention.

FIG. 7 is a flowchart illustrating a nanomaterial ribbon patterning method according to a second embodiment of the present invention and FIG. 8 is views illustrating the nanomaterial ribbon patterning method according to the second embodiment of the present invention. FIG. 9 is sectional views taken line A-A of FIG. 8 and illustrating the nanomaterial ribbon patterning method according to the second embodiment of the present invention, in which FIG. 9(a) is a sectional view taken along line A-A of FIG. 8. FIG. 10 is sectional views taken line B-B of FIG. 8 and illustrating the nanomaterial ribbon patterning method according to the second embodiment of the present invention, in which FIG. 10(a) is a sectional view taken along line B-B of FIG. 8. The nanomaterial ribbon patterning method according to this embodiment relates to negative type patterning.

Referring to FIG. 7 to FIG. 10, the nanomaterial ribbon patterning method according to this embodiment includes a first nanomaterial layer formation step S310, a second nanomaterial layer formation step S320, a thin layer formation step S330, a crack generation step S340, a sacrificial layer formation step S350, an etching step S360, a peeling step S370, and a ribbon pattern generation step S380.

The first nanomaterial layer formation step S310, the second nanomaterial layer formation step S320, the thin layer formation step S330, the crack generation step S340 and the sacrificial layer formation step S350 are the same as the first nanomaterial layer formation step S110, the second nanomaterial layer formation step S120, the thin layer formation step S130, the crack generation step S140 and the sacrificial layer formation step S150 of the first embodiment, and descriptions thereof will be omitted.

The etching step S360 may be a step in which a mask 460 is removed and etching P is performed to remove a portion 421 of a first nanomaterial layer 420 not covered by a sacrificial layer 470, that is, a second sacrificial pattern 472 and a thin layer 440.

In the etching step S360, by performing oxygen plasma etching P, the portion 421 of the first nanomaterial layer 420 not covered by the thin layer 440 and exposed through cracks 450 due to the absence of the second sacrificial pattern 472 may be removed. As a result, the cracks 450 may be formed not only on the thin layer 440 and the second nanomaterial layer 430, but also on the portion 421 of the first nanomaterial layer 420 not covered by the second sacrificial pattern 472. In addition, the upper surface of the substrate 410 may be exposed through the portion 421 of the first nanomaterial layer 420 not covered by the second sacrificial pattern 472 (see FIGS. 8(c) and (d) and FIGS. 9 (a) and (b)).

On the other hand, in the etching step S360, a portion of the first nanomaterial layer 420 disposed on the lower surface of the sacrificial layer 470 and covered by the sacrificial layer 470 may maintain an original shape even by the oxygen plasma etching P (see FIG. 8(c) and FIG. 10(a)).

The peeling step S370 may be a step wherein the sacrificial layer formed on an upper surface of the thin layer 440, that is, a first sacrificial pattern 471, the thin layer 440 and a second nanomaterial layer 430, are peeled off of the first nanomaterial layer 420 using an adhesive film 480.

In the peeling step S370, when the adhesive film 480 is moved away from the substrate 410, the first sacrificial pattern 471 adhesively attached to the adhesive film 480, the thin layer 440 formed on a lower surface of the first sacrificial pattern 471, and the second nanomaterial layer 430 formed on a lower surface of the thin layer 440 may be peeled off of the first nanomaterial layer 420 together with the adhesive film 480. In addition, the second sacrificial pattern 472 formed on the cracks 450 may remain on the upper surface of the first nanomaterial layer 420.

Further, all of other portions of the first nanomaterial layer 420 excluding the portion 421 thereof removed by oxygen plasma etching P may remain on the upper surface of the substrate 410 (see FIG. 8(d), FIG. 9(c) and FIG. 10(c)).

The nanomaterial ribbon pattern generation step S380 may be a step in which a nanomaterial ribbon pattern 490 constituted by a portion of the first nanomaterial layer remaining on the upper surface of the substrate 410 is formed by removing the sacrificial layer from the upper surface of the first nanomaterial layer 420, specifically the second sacrificial pattern 472.

In the nanomaterial ribbon pattern generation step S380, the nanomaterial ribbon pattern 490 may be formed by removing the portion 421 of the first nanomaterial layer 420 corresponding to a portion of the thin layer 440 and portions of the cracks 450 formed on the second nanomaterial layer 430 and not masked by the mask 460.

That is, the portions 421 of the first nanomaterial layer 420 not remaining on the upper surface of the substrate 410 may have a length corresponding to the length of portions of the cracks 450 masked by the mask 460 in the sacrificial layer formation step S350. In addition, a distance between the portions 421 of the first nanomaterial layer 420 not remaining on the upper surface of the substrate 410 may be regulated by regulating the thickness of the thin layer 440 in the thin layer formation step S330. Further, the width of the portions 421 of the first nanomaterial layer 420 not remaining on the upper surface of the substrate 410 may regulated by regulating the strain of the substrate 410 in the crack generation step S340, whereby the shape of the nanomaterial ribbon pattern 490 can be accurately controlled in formation of the nanomaterial ribbon pattern 490.

According to this embodiment, the nanomaterial ribbon pattern 490 may be formed in a sheet shape. As a result, a large-area nanomaterial ribbon pattern can be more easily and accurately realized with low manufacturing costs.

Although some embodiments have been described herein, it should be understood that these embodiments are provided for illustration only and the present invention can be easily modified into different forms by those skilled in the art without changing the technical idea or essential features of the present invention. Therefore, it should be understood that the above embodiments are provided for illustration only and are not to be construed in any way as limiting the present invention. For example, each component illustrated as a single component can be implemented by several components separated from each other and several components separated from each other can be implemented as a single component.

It should be understood that the scope of the present invention should be limited only by the appended claims and equivalents thereto and that various modifications, changes, alterations, and equivalent embodiments can be made by those skilled in the art without departing from the spirit and scope of the invention and equivalents thereto.

INDUSTRIAL APPLICABILITY

The present invention has industrial applicability in the field of a nanomaterial ribbon patterning method, which allows control of the width, length and spacing of a nanomaterial ribbon pattern, and a nanomaterial ribbon pattern formed thereby.

The invention claimed is:

1. A nanomaterial ribbon patterning method comprising:
forming a first nanomaterial layer having a first threshold strain on an upper surface of a substrate;
forming a second nanomaterial layer on an upper surface of the first nanomaterial layer;
forming a thin layer having a second threshold strain smaller than the first threshold strain on an upper surface of the second nanomaterial layer;
generating plural cracks on the thin layer and the second nanomaterial layer by applying tensile force to the substrate;
placing a mask on an upper surface of the thin layer, followed by forming a sacrificial layer on a portion of the thin layer and portions of the cracks not masked by the mask;
removing the mask and peeling off the sacrificial layer on the upper surface of the thin layer, the thin layer and the second nanomaterial layer from the first nanomaterial layer using an adhesive film;
performing etching to allow only the sacrificial layer on the cracks and the first nanomaterial layer under the sacrificial layer to remain; and
removing the sacrificial layer to form a nanomaterial ribbon pattern constituted by a portion of the first nanomaterial layer remaining on the upper surface of the substrate.

2. The nanomaterial ribbon patterning method according to claim 1, wherein the nanomaterial ribbon pattern has a length corresponding to a length of the portions of the cracks not masked by the mask in formation of the sacrificial layer.

3. The nanomaterial ribbon patterning method according to claim 1, wherein the nanomaterial ribbon pattern has a spacing regulated by regulating a thickness of the thin layer in formation of the thin layer.

4. The nanomaterial ribbon patterning method according to claim 1, wherein the nanomaterial ribbon pattern has a width regulated by regulating strain of the substrate in generation of the cracks.

5. A nanomaterial ribbon patterning method comprising:
forming a first nanomaterial layer having a first threshold strain on an upper surface of a substrate;
forming a second nanomaterial layer on an upper surface of the first nanomaterial layer;
forming a thin layer having a second threshold strain smaller than the first threshold strain on an upper surface of the second nanomaterial layer;
generating plural cracks on the thin layer and the second nanomaterial layer by applying tensile force to the substrate;
placing a mask on an upper surface of the thin layer, followed by forming a sacrificial layer on a portion of the thin layer and portions of the cracks not masked by the mask;
removing the mask and performing etching to remove portions of the first nanomaterial layer not covered by the sacrificial layer and the thin layer;
peeling off the sacrificial layer on the upper surface of the thin layer, the thin layer and the second nanomaterial layer from the first nanomaterial layer using an adhesive film; and
removing the sacrificial layer from the upper surface of the first nanomaterial layer to form a nanomaterial ribbon pattern constituted by a portion of the first nanomaterial layer remaining on the upper surface of the substrate.

6. The nanomaterial ribbon patterning method according to claim 5, wherein a portion of the first nanomaterial layer not remaining on the upper surface of the substrate in formation of the nanomaterial ribbon pattern has a length corresponding to a length of portions of the cracks masked by the mask in formation of the sacrificial layer.

7. The nanomaterial ribbon patterning method according to claim 5, wherein a distance between portions of the first nanomaterial layer not remaining on the upper surface of the substrate in formation of the nanomaterial ribbon pattern is regulated by regulating a thickness of the thin layer in formation of the thin layer.

8. The nanomaterial ribbon patterning method according to claim 7, wherein the portion of the first nanomaterial layer not remaining on the upper surface of the substrate in formation of the nanomaterial ribbon pattern has a width regulated by regulating strain of the substrate in generation of the cracks.

* * * * *